United States Patent [19]

Pastor

[11] 4,251,315
[45] Feb. 17, 1981

[54] METHOD OF GROWING METAL HALIDE AND CHALCOGENIDE CRYSTALS FOR USE AS INFRARED WINDOWS

[75] Inventor: Antonio C. Pastor, Santa Monica, Calif.

[73] Assignee: Hughes Aircraft Company, Culver City, Calif.

[21] Appl. No.: 743,264

[22] Filed: Nov. 19, 1976

[51] Int. Cl.³ .............................................. C30B 21/02
[52] U.S. Cl. ................................. 156/616 R; 164/60; 156/DIG. 71
[58] Field of Search ....... 156/616, DIG. 83, DIG. 89, 156/DIG. 71, DIG. 84, DIG. 88, 619, DIG. 72; 432/262, 263; 423/499; 350/2; 164/60

[56] References Cited

U.S. PATENT DOCUMENTS

| | | | |
|---|---|---|---|
| 1,793,672 | 2/1931 | Bridgman | 156/616 |
| 2,984,626 | 5/1961 | Lefever | 156/616 |
| 3,009,788 | 11/1961 | Daimon | 156/616 |
| 3,382,047 | 5/1968 | Holtzberg et al. | 156/616 X |
| 3,625,275 | 12/1971 | Copley et al. | 156/616 X |
| 3,796,552 | 3/1974 | Robinson et al. | 156/DIG. 83 X |
| 3,899,304 | 8/1975 | Linares | 156/DIG. 71 X |
| 3,926,566 | 12/1975 | Spurnly | 156/DIG. 71 |

OTHER PUBLICATIONS

Butler et al. "A Method for Purification and Growth of KCl Single Crystals" Oak Ridge Natl. Lab. Report Contract No. W-7405-eng-26 (Feb. 19, 66), pp. 1-9, 27.

Primary Examiner—Hiram Bernstein
Attorney, Agent, or Firm—B. T. Hogan, Jr.; W. H. MacAllister

[57] ABSTRACT

Disclosed is a method of producing metal halide and metal chalcogenide crystals for infrared window application which exhibits a high conversion ratio.

6 Claims, 4 Drawing Figures

METHOD OF GROWING METAL HALIDE AND CHALCOGENIDE CRYSTALS FOR USE AS INFRARED WINDOWS

RELATED INVENTION

U.S. application Ser. No. 743,263 (now U.S. Pat. No. 4,110,080 dated Aug. 29, 1978) by applicant herein filed herewith discloses a novel crystal growth crucible. The invention described herein utilizes one species of the novel crucible disclosed in U.S. application Ser. No. 743,263.

Both inventions are the property of Hughes Aircraft Company, having been assigned to Hughes by applicant.

BACKGROUND OF THE INVENTION

1. Field of the Invention

This invention is directed generally to an apparatus and method for growing large single crystals of metal halides and chalcogenides and more particularly to the size-scale-up technology in the growth and preparation of single-crystal optical components (such as windows and lenses) of metal halides and chalcogenides.

2. Prior Art

The common procedure for preparing IR windows from metal halides or chalcogenides is to grow circular cylindrical ingots of a diameter exceeding that of the window to be fabricated, and of a cylindrical length (after the conical ends have been cut off) several times the thickness of the window. With this shaping of ingot, it is not practical to grow an ingot that will yield one window, for the conversion ratio of usable to discarded material would be very poor. These prior art IR window production methods therefore require several steps of fabrication, viz cutting, grinding, and polishing. As a rule, as the number of fabrication steps required to convert the ingot to the finished product increases, the conversion ratio of the material decreases. This phenomenon has the effect of increasing the cost of the finished product.

Other disadvantages of the prior art methods are contamination problems, associated with the multiple fabrication steps, and the attendant technical and economic difficulties in scaling up the crystal growth process to yield IR windows having large diameters.

The difficulty in producing large IR windows or other large optical components by conventional crystal growth processes may be defined as a production scale-up problem. Since conventional crystal growth processes yield optical components at a relatively low conversion ratio, the amount of material required to yield large IR windows is exceedingly large. For an increase in the linear dimension of an optical component by a factor of $X=6$, there will be an associated increase in the mass of material required to yield the components by a factor of 216. A scaled-up boule of potassium chloride of a diameter of 12 inches will weigh more than 150 kg. Obviously, the production and handling of such a mass will require special machinery occupying precious space and a scaled-up more elaborately instrumentalized furnace necessitating a high power input.

These observations clearly point to the necessity of casting the single-crystal ingot during its growth to a shape which, while amenable to the constraints of growth of materials of high crystalline quality, will require the minimum of fabrication to the configuration and finish of the final product. Applicant knows of no prior art crystal growth process which meets the above stated requirements.

THE INVENTION

Summary of the Invention

In order to provide a process which overcomes most, if not all, of the aforedescribed disadvantages of the prior art, I have developed a novel method of growing large single crystals of metal halides and/or chalcogenides for use in the fabrication of infrared windows and other optical components. My method consists essentially of growing monocrystals from a melt of polycrystalline starting materials in a polyhedral configuration, such that the grown crystals exhibit major and minor surfaces, instead of growing crystals in the shape of a cylindrical ingot.

The method involves, among other things, the use of a furnace which consists of flat, vertical parallel heaters baffled against convection in addition to a container or crucible, with a volume bounded, in part at least, by two substantially parallel planes, suitable for drawing through the furnace in Bridgman-Stockbarger style.

The crystal growth charge is placed into the specially designed crucible or container and subsequently raised to a temperature above its melting point by the aforementioned furnace. The crystal growth environment may be completely evacuated by vacuum techniques or charged with a positive atmosphere of reactive gases.

Crystal growth is initiated by introducing a coolant into the lower end of the charge crucible and slowly removing said crucible from the furnace.

The resulting crystal will conform to the geometrical configuration of the container and thereby be amenable to subsequent use as optical or laser components with a minimum amount of manual processing or fabrication.

In seeking to avoid the problems and disadvantages attendant unto the above mentioned prior art processes for preparing large metal halide single crystal optical components, this invention has as its principal objective the provision of a method for growing large metal halide single crystals that minimizes the propensity for damaging the surfaces of the components. A second objective of this invention is to provide a practical method for economically producing large scale metal halide single crystal. A still further objective of this invention is to provide a practical method of producing large metal halide single crystal which will meet typical laboratory space and material handling constraints.

DETAILED DESCRIPTION OF THE INVENTION

Figure 1:
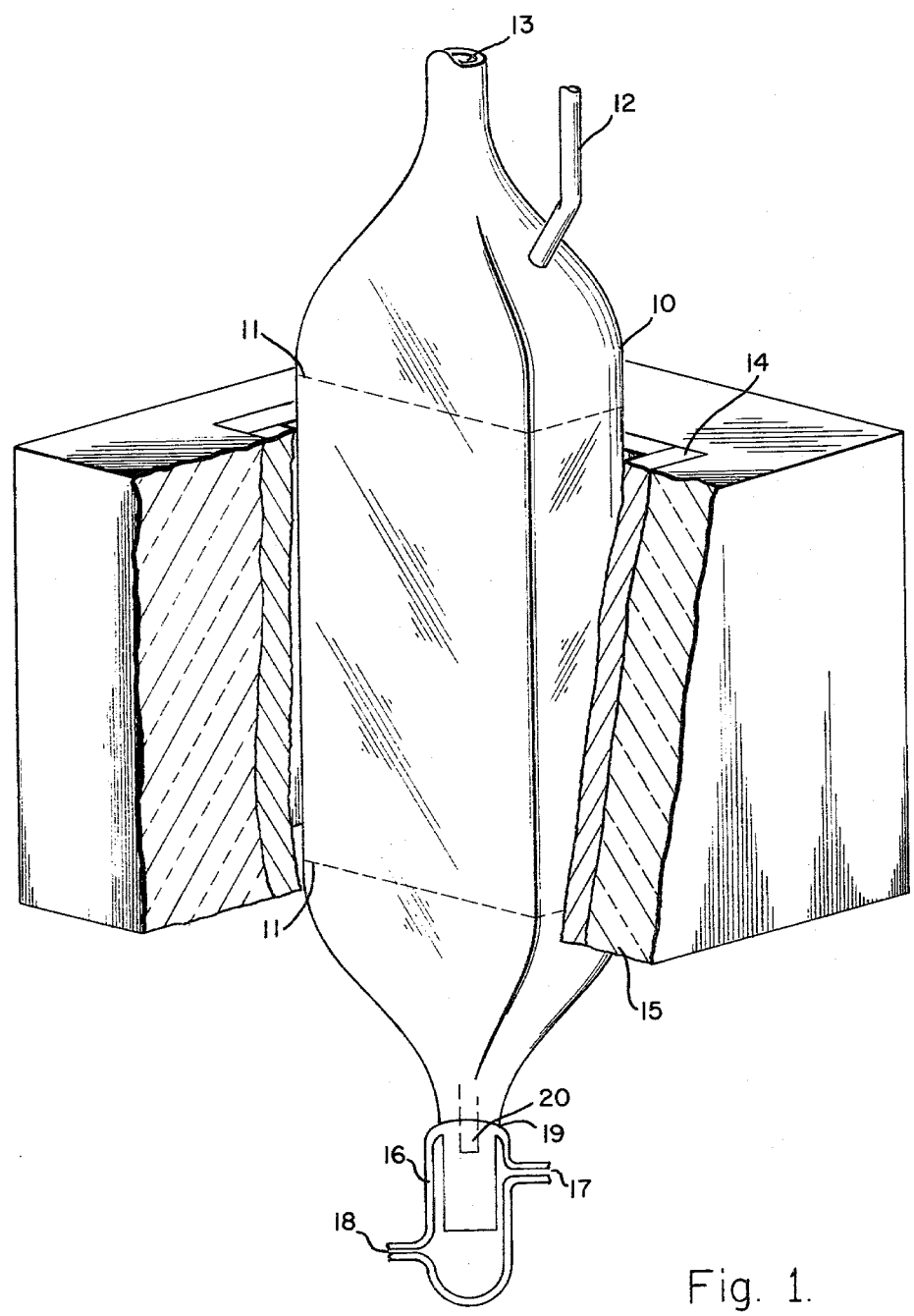
FIG. 1 is a cut away view of a flat crystal growth apparatus.

This invention meets the constraints of the first objective in that it allows one to grow flat metal halide boules. In windows and lens blanks, the optical quality of the faces of the blanks must be preserved. Therefore, these faces should be subjected to as little fabrication as possible after growth. As stated above, in the prior art, these blanks are prepared by slicing a circular cylindrical ingot. The cutting is performed right along the faces of the intended blanks. The growth of the boule via this invention allows one to grow the boule to the required thickness of the blank. Any subsequent cutting is along the edges of the blank which favors the preservation of the quality of the faces of the blank. This technique also reduces the cost of cutting the component (which is an expensive time-consuming operation) because it reduces the area of the surface to be cut typically by a factor of ½.

The second objective is met in that a flat crystal growth process offers the lesser scale-up factor which in turn leads to great economics in the scale-up of production plant and equipment. This advantage, and that of providing a method which meets space and material handling constraints, can be further explained as follows: If the linear dimension of the product crystal must be scaled by a factor X, then areas must be scaled up by the factor X, and volumes by the factor X. Since masses increase as volumes, they also increase as X. Material or heat flows, on the other hand, increase in proportion to the area normal to the direction of flow, and therefore, increase as X.

Translated into practical terms, this means a typical 2-inch diameter conventional boule of KCL which weighs 0.7 kg would weigh 151 kg if scaled by a factor $X=6$. Such a mass cannot be handled by one man. Special machinery would have to be improvised for the handling of the material throughout the entire process, and additional space provided in the laboratory to accommodate such machines.

The crystal growth furnace, being merely a device that controls the pattern of heat flow, must be scaled up by the factor $X^2=36$ in both its physical configuration and its power rating. Since the 2-inch diameter conventional boule requires 1.5 w, its scaled-up counterpart will require 54 kw. To a scale factor of 36 for the size of the furnace proper must be added space for auxiliary machinery for the handling of the charged crucible before, during, and after the furnace operation which therefore increases the space requirements to a factor greater than 36.

When one compares the scale-up factors, associated with the production of a 12-inch diameter KCL crystal optical component via conventional crystal growth techniques, to the scale-up factors for a similar optical component prepared by a flat crystal growth process, the advantages of the latter process are evident. A two-inch wide by 0.5-inch thick flat boule of KCL weighs 120 g; therefore, a 12-inch wide flat boule (i.e., a 2-inch boule scaled-up by a factor of 6) will weigh around 26 kg, which is still within the handling capabilities of an able-bodied man. The 2-inch wide flat boule requires a furnace with a power output of 0.5 kw; therefore, the scaled-up furnace would require an output of 18 kw.

This invention is practiced by utilizing a specially prepared flat crystal growth crucible as shown in FIG. 1. Referring to FIG. 1, a crystal growth crucible 10, having a rectangular cross-section 11 fabricated from a suitable material such as vitreous silica, cast vitreous carbon or low porosity graphite is charged with a reagent grade metal halide starting material.

Vitreous silica is a preferred material for the fabrication of the crucible because it is readily available in rectangular cross-sections. The upper portion of the crucible 10 may be designed to facilitate a conventional Bridgman crystal growth process, a vacuum crystal growth process or a Reactive Atmospheric Process crystal growth method (RAP).

As shown in FIG. 1, the crucible is designed to facilitate a RAP crystal growth process in that it is provided with an inlet 12 for the introduction of reactive gases and an outlet 13 for the removal of the reactive gases. For vacuum crystal growth processes, the inlet line 12 is sealed and an evacuation system is connected to the outlet line 13.

In the case of KCl, approximately 26 kg of polycrystalline starting material is needed to produce a single crystal boule having a 12" diameter and a 3" thickness. The charge powder is approximately one-half as dense as the crystal. Therefore, the crucible volume should be double the volume of the crystal. This makes the crucible roughly twice as long as the boule.

The charged crucible is then placed into the furnace 14 capable of raising the temperature of the crucible and its charge to a level sufficient to render the charge molten. The furnace should consist of at least two flat, vertical, parallel heaters baffled 15 against connection, through which the crucible may be drawn in Bridgman-Stockbarger style. This furnace must be at least as long as the crucible to create an even thermal gradient throughout the melt. Power requirements on the order of 25 kw are necessary, depending upon the melting point of the charge material, the composition of the crucible material and the type of insulation material (not shown) used to insulate the crucible.

In a RAP production of KCl single crystals, the temperature of the crucible and charge is raised to 800° C. and a RAP agent selected from nascent halogen source materials such as HCl, $CCl_4$, $COCl_2$ and the like mixed with an inert carrier gas such as helium or argon or a reactive carrier gas such as $CO_2$, is introduced into the crucible through the inlet 12. A dynamic purge is created and maintained by allowing the RAP agent to flow through the crucible and exit via the outlet 13. For the preparation of a 12" diameter boule a flow rate of approximately 7 liters per minute is adequate.

The charge is rendered molten by the increase in temperature and the interior walls of the crucible are baked in the presence of the RAP agent purge. This facilitates a cleansing or purification of both the charge material and the inner surface or walls of the crucible. This phase of the process may be referred to as the pre-growth material purification and reaction vessel purge.

After an extended purge period at the elected elevated temperature, a coolant is introduced into the lower end of the crucible 10 which contains a cooling jacket 16 comprised of a coolant inlet 17 and coolant outlet 18 built into the crucible stem 19. The time period of the extended purge will depend upon the actual purity of the charge materials. A monitoring device may be installed on the outlet line to test the effluent gas for evidence of the removal of unwanted contaminants.

The introduction of the coolant will lower the temperature of the molten halide below its melting point and crystal nucleation will occur in the capillary area 20 of the crucible stem 19. At this point the crucible may be slowly lowered or the furnace slowly raised to effect a "pull rate" of approximately 1 millimeter per hour. This phase of the process is referred to as the crystal growth phase.

For small crystal growth processes it is convenient to lower the crucible. When one prepares large crystals, the furnace may be raised instead to effect crystal growth. Temperature control is extremely important during the pulling process. One seeks to maintain a uniform thermal gradient throughout the crystal cross-section. Therefore, temperature sensing is best carried out by placing the temperature probe as close to the center of the cross-section of the growing crystal as possible. What determines this closeness is the minimum linear dimension of the cross-section of the crystal. In circular cylindrical crystal growth, there is no minimum linear dimension. The closest point is one radius away from the center. In the inventive process, flat growth, the minimum linear dimension is the thickness. Therefore, the closest probe point is half the thickness away from the center (typically closer by a factor of 8 than in the cylindrical crystal growth process).

The crystal growth phase is followed by a crystal cool down phase in which all power to the furnace is turned down and the crucible containing the newly formed single crystal is allowed to cool. The presence of external insulation about the periphery of the crucible serves to control the rate and direction of cooling.

For RAP crystal growth processes, the RAP agent dynamic purge is maintained throughout the crystal growth phase and crystal cool down phase after the removal of all external heat inputs.

When completely cooled, the crucible may be cut along the upper portion of its cross-section 11 for removal of the single crystal boule.

Figure 2A:
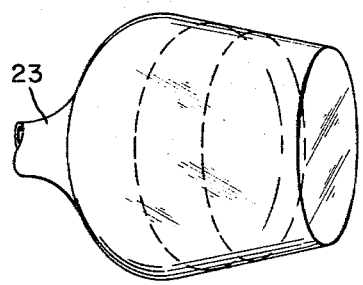
FIG. 2a shows a schematic sketch of a metal halide boule grown by the prior art Cyochralski Method.
Figure 2B:
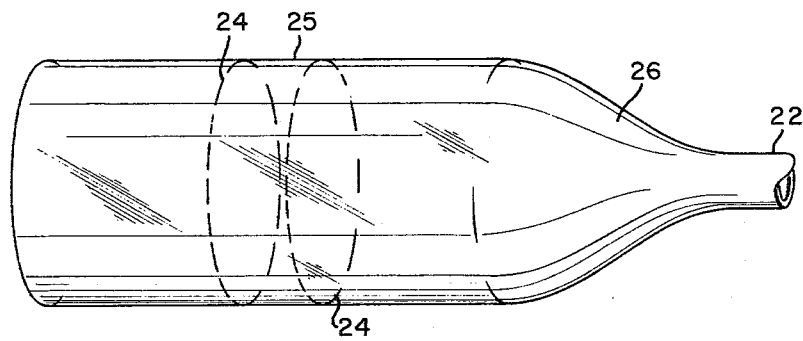
FIG. 2b shows a schematic sketch of a metal halide boule grown by the prior art Bridgman Method.
Figure 2C:
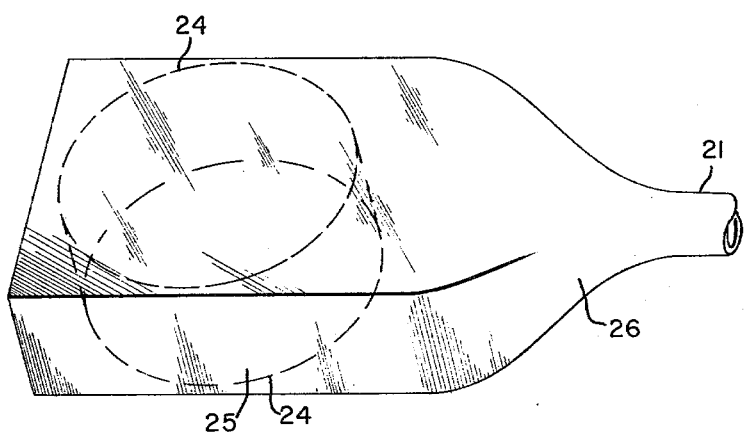
FIG. 2c shows a schematic sketch of a metal halide boule grown from the inventive process utilizing a flat crystal growth crucible similar to that shown in FIG. 1.

Referring to FIG. 2 one can readily compare a single crystal boule prepared via the above-described invention 21 with single crystals prepared by prior art Bridgman 22 and Czochralski 23 methods. An optical component having a diameter matching the width and a thickness equal to that of the flat boule may be cut from the boule prepared by the inventive crystal growth process 21 with little or no damage to the faces 24 of the crystal. The conversion ratio (ratio of usable material per optical component 25 to unusable material 26) is considerably higher than that which one obtains when an optical component is cut from boules prepared via the prior art processes. While the prior art process taught by Bridgman has the propensity for yielding multiple optical components from a single boule and therefore increasing the conversion ratio, this advantage is offset by the necessity of cutting the boule along the face of the components which degrade the optical quality of the crystal.

Having fully disclosed and described how to make and use my invention, the scope of my claim may be understood to be as follows.

What is claimed is:

1. A process for growing monocrystalline optical materials having substantially parallel uncut major surfaces, comprising the steps of:
    (a) providing a container with a volume which is bounded in part at least by two substantially parallel planes which correspond to said major surface of material to be grown;
    (b) depositing a polycrystalline material in said container;
    (c) melting said polycrystalline material in a controlled temperature zone;
    (d) introducing a coolant into the lower end of said container whereby the temperature of said molten material is lowered to its crystallization point and a solid liquid interface is established;
    (e) moving said interface along one dimension of said polycrystalline melt to cause recrystallization of said melt along said parallel planes and thereby convert said melt to monocrystalline material whereby the ratio of the surface area of said major surface to the volume of the grown monocrystalline material boule is maximized.

2. The process of claim 1 including the additional steps of:
    (a) purging said container containing said molten polycrystalline charge with a reactive atmospheric gas while creating said controlled temperature zone;
    (b) maintaining said reactive atmosphere purge throughout said process and allowing said monocrystalline material to cool to ambient temperatures.

3. A process for fabricating single crystal infrared window components having substantially parallel uncut major surfaces comprising:
    (a) providing a container with a volume which is bounded in part at least by two substantially parallel planes which correspond to said major surfaces of material to be grown;
    (b) depositing a polycrystalline material in said container;
    (c) melting said polycrystalline material in a controlled temperature zone;
    (d) introducing a coolant into the lower end of said container whereby the temperature of said molten material is lowered to its crystallization point and a solid liquid interface is established;
    (e) moving said interface along one dimension of said melt to cause recrystallization of said melt along said parallel planes and thereby convert said melt to monocrystalline material whereby the ratio of the surface area of said major surface to the volume of the grown monocrystalline material boule is maximized; and
    (f) removing unwanted material from said crystal by cutting said crystal boule along its minor axis.

4. In the art of growing large metal halide single crystals, an improved crystal growth process comprising the placing of metal halide charge powders into a crystal growth crucible having a rectangular cross-section, placing said charged crucible into a furnace having at least two vertical flat plate heating elements baffled from convection by an insulation material, causing said metal halide charge to become molten by raising the temperature of said furnace, initiating crystal nucleation within said molten halide by introducing a coolant into said crucible whereby the temperature of said halide is lowered below its melting point, creating a moving thermal gradient through said crucible by causing said crucible to be removed from said furnace thereby allowing a single crystal to be formed within said crucible, and allowing said single crystal to cool prior to its removal from said crucible.

5. The process of claim 4 wherein said crucible is comprised of a rectangular cross-section affixed to a stem having a coolant inlet and outlet, and an inlet and outlet means for the introduction of and removal of gases from said crucible.

6. The process improvement of claim 4 wherein said molten halide is subjected to the cleansing action of a dynamic reactive atmospheric processing agent introduced into said crucible prior to the introduction of said coolant into said crucible and removal of said crucible from said furnace.

* * * * *